United States Patent
Guruz et al.

(10) Patent No.: US 7,531,907 B2
(45) Date of Patent: May 12, 2009

(54) SYSTEM AND METHOD FOR FORMING SERIAL NUMBERS ON HDD WAFERS

(75) Inventors: Unal Murat Guruz, San Jose, CA (US); Mary Kathryn Gutberlet, Prunedale, CA (US); Douglas Johnson Werner, Fremont, CA (US); Yvette Chung Nga Winton, San Francisco, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 778 days.

(21) Appl. No.: 11/151,118

(22) Filed: Jun. 13, 2005

(65) Prior Publication Data
US 2006/0246381 A1 Nov. 2, 2006

Related U.S. Application Data

(60) Provisional application No. 60/676,630, filed on Apr. 29, 2005.

(51) Int. Cl.
 *H01L 23/544* (2006.01)
(52) U.S. Cl. .................. 257/797; 257/E23.179
(58) Field of Classification Search .......... 257/797
See application file for complete search history.

(56) References Cited

U.S. PATENT DOCUMENTS

| | | | | |
|---|---|---|---|---|
| 4,134,066 A * | 1/1979 | Vogel et al. | ............ | 324/210 |
| 5,376,589 A * | 12/1994 | Thienel | ............ | 438/462 |
| 5,642,307 A * | 6/1997 | Jernigan | ............ | 365/103 |
| 5,894,172 A * | 4/1999 | Hyozo et al. | ............ | 257/797 |
| 6,303,899 B1 * | 10/2001 | Johnson et al. | ............ | 219/121.69 |
| 6,420,792 B1 * | 7/2002 | Guldi et al. | ............ | 257/797 |
| 6,476,499 B1 * | 11/2002 | Hikita et al. | ............ | 257/777 |
| 6,635,333 B2 * | 10/2003 | Grigg et al. | ............ | 428/134 |
| 6,710,364 B2 * | 3/2004 | Guldi et al. | ............ | 250/559.44 |
| 6,759,248 B2 * | 7/2004 | Mautz et al. | ............ | 438/3 |
| 6,953,948 B2 * | 10/2005 | Sakaguchi | ............ | 257/48 |
| 7,007,855 B1 * | 3/2006 | Barker et al. | ............ | 235/494 |
| 7,100,826 B1 * | 9/2006 | Phan et al. | ............ | 235/385 |
| 7,348,682 B2 * | 3/2008 | Brambilla et al. | ............ | 257/797 |
| 2003/0141605 A1 * | 7/2003 | Lee et al. | ............ | 257/797 |

FOREIGN PATENT DOCUMENTS

JP  2004296086 A  10/2004

\* cited by examiner

*Primary Examiner*—David A Zarneke
(74) *Attorney, Agent, or Firm*—John L. Rogitz

(57) ABSTRACT

Both the wafer serial number and slider region location indicia on the wafer are formed on the front surface of the wafer using optical principles, i.e., without using a laser.

2 Claims, 2 Drawing Sheets

SYSTEM AND METHOD FOR FORMING SERIAL NUMBERS ON HDD WAFERS

This application claims priority from U.S. provisional patent application Ser. No. 60/676,630, filed Apr. 29, 2005.

FIELD OF THE INVENTION

The present invention relates generally to devices created by wafer processing, such as micromachines and semiconductors, and more particularly to controller chips for hard disk drives.

BACKGROUND OF THE INVENTION

Read/write head structures colloquially known as "sliders" typically are manufactured in groups on a semiconductor wafer. To track individual sliders, heretofore indicia representing each slider's position on the wafer have been optically formed on the "front" of the wafer next to each slider, while a serial number representing the wafer has been formed by laser projection or etching on the "back" surface of the slider. Such tracking a necessary for, e.g., process control, to ascertain for instance whether sliders at a particular wafer position wafer-to-wafer are being defectively made, or whether a particular wafer or series of wafers produce defective sliders.

As critically recognized herein, present processing of slider wafers can require lapping the wafers to be even thinner than they are when they are originally received from the wafer supplier with the wafer serial numbers on the back surfaces. This can entail lapping the back surface in a way that erases the serial numbers. Moreover, the present invention recognizes that forming serial numbers using projection technology such as lasers can produce contaminants during the ablating process, leading to eventual slider failures. Still further, the present invention critically recognizes that with ever-shrinking slider dimensions, the resolution and placement afforded by laser technology grows ever more insufficient. Additionally, with respect to etching, a small etch cavity may remain after etching, and the cavity may trap debris, contaminating the device. With these critical recognitions in mind, the present invention is provided.

SUMMARY OF THE INVENTION

Embodiments of the invention describe methods for creating serial numbers on devices using optical lithography and processes. The serial numbers thus created are unique to every slider device fabricated: a unique within-wafer component distinguishes between devices on a given wafer, while a unique wafer-number component distinguishes between similarly-located devices on different wafers. The optical printing technique described herein has several advantages over current methods of serialization. First, cost is reduced. Second, the resolution capability of optical methods and processing allows for the creation of smaller serial numbers, thus consuming less area which may be devoted to functional device features. Third, the accuracy of placement of serial number digits and characters is superior, allowing for easier recognition by automated number-reading machinery. And, no cavities from serialization remain at the end of processing, reducing contamination. The present method can be applied to all substrate types and any surface of these substrate types.

Accordingly, a method for establishing identification on a wafer defining a front surface includes, for each of a plurality of slider regions on the wafer, optically forming on the front surface indicia representing the location of the slider region relative to the wafer. The method also includes optically forming, on the front surface, at least one serial number that is unique to the wafer and thus that is not dependent on a particular location on the wafer. By "optically formed" is meant that, for instance, a reticle may be used but a projecting device such as a laser is not used.

In non-limiting embodiments plural computer instruction files (sometimes referred to herein as "stepper files" or "stepper job files") may be established for each location on the wafer that a number might be prospectively formed, with one file being established for each number (e.g., for each of a multiplicity of alphabet characters and numeric digits, collectively referred to herein as "alphanumeric characters") that might prospectively be formed at the location. Accordingly, the serial number for a wafer can be received and based thereon the set of instruction files automatically invoked to appropriately activate a light source and/or to select a reticle or reticles and/or to move the wafer and/or reticles as required to establish the serial number (as well as location indicia) in the appropriate locations. The serial number may be formed once on the surface, or adjacent each of plural slider regions, or indeed adjacent each and every slider region.

In another aspect, a wafer includes a front surface and an opposed back surface. Indicia representing a location on the wafer of each of plural slider regions are formed on the front surface. Additionally, at least one serial number is on the front surface and represents the wafer itself. No unfilled cavities exist that otherwise would be associated with the indicia and that consequently otherwise would trap contaminants on the wafer.

In yet another aspect, a method for forming at least one serial number and plural wafer location indicia on the front surface of a wafer includes receiving the serial number, and correlating at least the serial number to plural files in a predetermined set of stepper job files. The method also includes invoking the plural files to cause a light source to expose at least one reticle juxtaposed with the wafer. In this way, a photoresist pattern representative of the serial number and wafer location indicia is established on the wafer. The method then includes physically transferring the pattern to a permanent wafer structure.

In still another aspect, a method for serializing devices on wafers includes establishing a set of reticles and stepper job files based on the type of identification to place each alphanumeric character of a serialization. The method also includes providing to a host computer system a wafer number using a serial reader, and determining appropriate stepper jobs and reticles using each alphanumeric character of the wafer number. Still further, the method of this aspect includes correlating each wafer number alphanumeric character to a specific reticle and location on the reticle, selecting appropriate stepper jobs and reticles for the wafer, and exposing a resist pattern on the wafer in accordance with the selecting act to establish an exposed resist pattern on the wafer. This aspect of the method further includes transferring the exposed resist pattern onto permanent wafer structure by at least one post-lithographic process, and encapsulating serial numbers patterned on the permanent wafer structure in a material transparent to a reading device.

In another aspect, a wafer includes a wafer body having a plurality of devices formed upon the wafer. Each of the devices has a unique serialization number associated with it and the serialization number is not adjacent to the wafer back surface.

The details of the present invention, both as to its structure and operation, can best be understood in reference to the accompanying drawings, in which like reference numerals refer to like parts, and in which:

DETAILED DESCRIPTION

Figure 1:
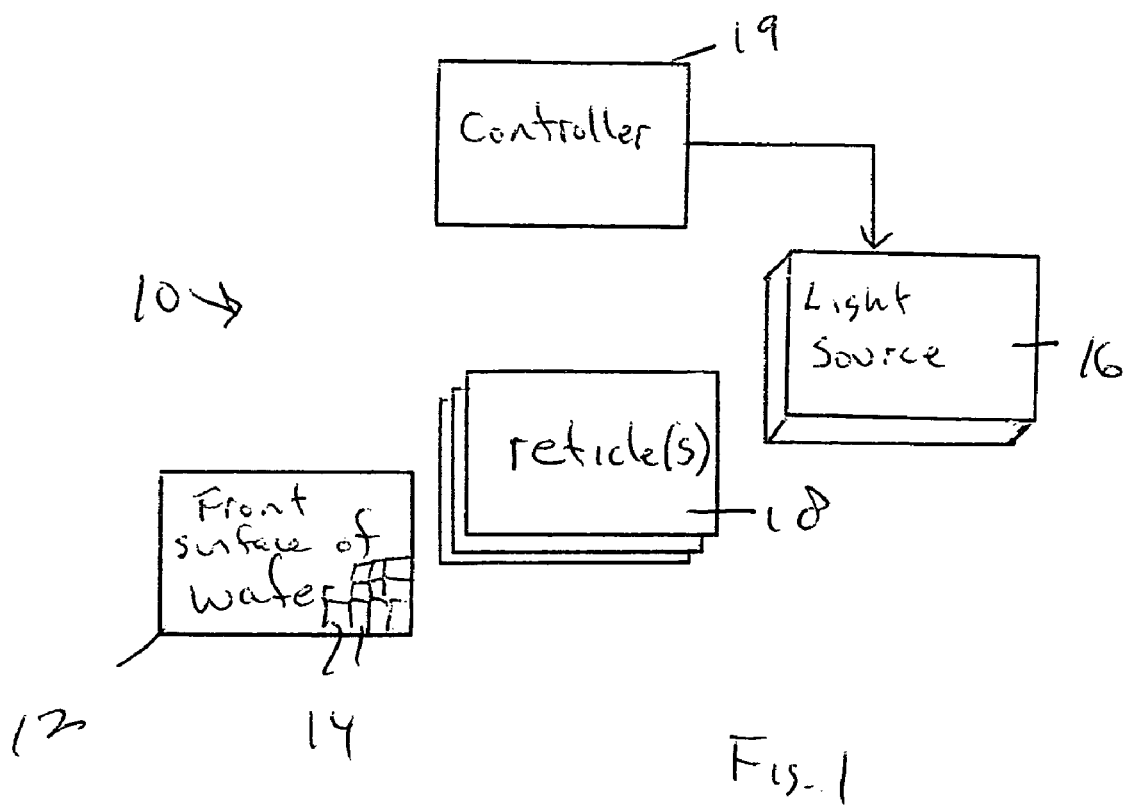
FIG. 1 is a schematic diagram of a system according to the present invention.

Referring initially to FIG. 1, a system is shown, generally designated 10, in which the front surface of a wafer 12 bearing plural slider regions 14 is illuminated by light from a light source 16 passing through a set of reticles 18. The light source 16 and/or reticles 18 and/or wafer 12 are controlled by a controller 19 having a core processor and memory such as but not limited to solid state or disk memory for executing at least portions of the logic of FIG. 2. The controller 19 may be referred to as a "stepper" or "optical stepper". By "set" of reticles is meant one or more optical reticles configured in accordance with optical photoresist principles in the semiconductor art. As set forth further below, the controller 19 controls the energization of the light source 16 and/or the position of the reticles 18 relative to the wafer 12 to form numbers on the front surface of the wafer 12 that indicate both the serial number of the particular wafer 12 itself, as well as indicia (e.g., column and row number) representing the location on the wafer 12 of each slider region 14.

Figure 2:
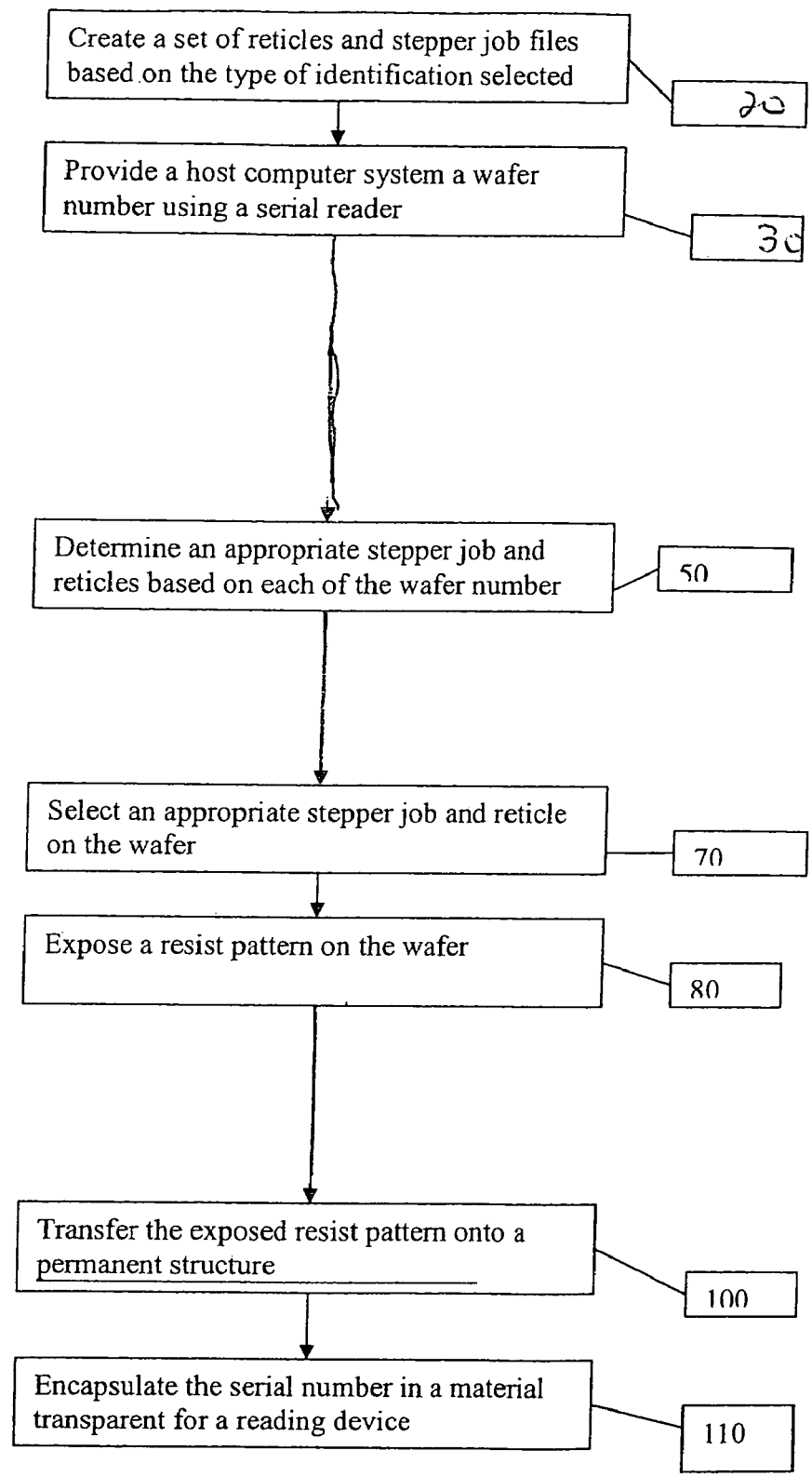
FIG. 2 is a flow chart of an example of the present logic.

Turning now to FIG. 2, one implementation for serializing slider devices on a wafer is shown. The process described takes advantage of the flexibility of optical steppers, which can be programmed to establish patterns on wafers using different reticles or portions thereof on a by-wafer basis.

Commencing at block 20, based on the type of identification needed, a set of reticles and stepper job files are created to place each alphanumeric character of the serialization. With greater specificity, at block 20, anticipating that each slider region 14 on the front surface of the wafer 12 can require one of a multiplicity of alphanumeric characters to be formed in each position of a sequence of alphanumeric characters that is to be formed nearby each slider region 14 (typically in a predetermined location on or near the slider region 14), a set of reticles and associated stepper "jobs" or "job files" (i.e., computer instructions) is created such that any one of the alphanumeric characters can be formed in each prospective alphanumeric character location on the wafer 12. As is known in the art, a "stepper job file" is an instruction executed by the controller 19 to activate the light source 16 and/or to move the wafer relative to the reticle(s) (or vice-versa) and/or to select one of plural reticles in such a way as to irradiate a predetermined location of the reticle(s) 18 and, hence, to expose a predetermined location on the wafer 12. Accordingly, for each prospective wafer location on which a serial number/wafer location indicia is to be formed, multiple stepper jobs are created, one for each of the possible alphanumeric characters that may be required in that location.

It is to be understood that while the logic of FIG. 2 contemplates forming both the wafer serial number and the wafer position indicia (e.g., column and row numbers) next to each slider region 14, the wafer serial number may be formed only once on the front surface or only next to some, but not all, slider regions 14. It is to be further understood that while the logic of FIG. 2 allows for any one of the potential alphanumeric characters to be formed in any prospective serial/position number location on the wafer 12, in some implementations more or fewer alphanumeric characters may be needed to uniquely identify the wafer and/or wafer location of a slider region. Thus, the set of reticles with associated stepper job files in essence contain all alphanumeric characters required to create any numeric character.

Moving to block 30, the controller 19 is given the wafer number by, e.g., a serial number reader, a manual type-in, a database look-up, or other means. Proceeding to block 50, each alphanumeric character of the wafer number is used to determine the appropriate stepper job and reticles needed to form that alphanumeric character in the appropriate location on the wafer 12. To this end, software can be used to automatically correlate the desired alphanumeric characters and locations into stepper job data. Recall that at block 20 a set of stepper jobs, one for each unique alphanumeric character, was created for each prospective alphanumeric character location on the wafer 12. Accordingly, in one implementation the correlation software at block 50 simply takes, as input, the desired alphanumeric character and its desired location and then invokes the associated stepper job. In other words, each wafer number alphanumeric character corresponds to a specific reticle and location on that reticle, such that the reticle, location on the reticle for each alphanumeric character, and the location of the alphanumeric character on the wafer determine the correct stepper job from a variety of preprogrammed jobs.

Once the appropriate stepper jobs have been determined at block 50, at block 70 they are selected for execution. At block 80 the light source 16 is activated to expose the wafer 12 in accordance with the selected stepper jobs, it being understood that appropriate photoresist material is first deposited onto the wafer 12 in accordance with photoresist principles in the art. It is to be further understood that the particular photoresist characteristics are determined by subsequent processing requirements explained briefly below.

Block 100 indicates that the exposed resist pattern is transferred to a permanent wafer structure by appropriate post-lithographic processes. For example, depositions, liftoff, plating, subtractive etching by ion milling or reactive ion etching can be used to transfer the exposed pattern to the wafer 12 and to remove unexposed resist regions in accordance with photoresist principles in the art. At block 110, after formation the serial numbers may be encapsulated if desired in any material which is transparent to the reading device that is to be used to read the numbers. For example, aluminum oxide may be used as the encapsulating substance. This fills in whatever cavities may otherwise exist over the serial number alphanumeric characters and, hence, prevents contamination from being trapped in the finished device. Post-lithographic processing to, e.g., form sliders from the slider regions 14 may then be executed.

Figure 3:
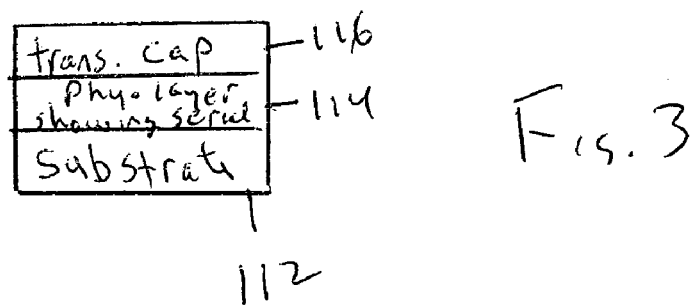
FIG. 3 is a simplified elevational cross-section showing the encapsulating layer over the serial number layer.

FIG. 3 shows a simplified cross-section of the finished product, in which a substrate 112 bears on its "front" surface a physical layer 114 formed in accordance with the above disclosure, i.e., the physical layer contains the wafer serial number. A transparent cap 116 such as but not limited to the above-mentioned aluminum oxide covers the physical layer 114 such that no cavities exist over the serial number alphanumeric characters to trap contaminants. Other layers of the wafer are omitted for clarity.

While the particular SYSTEM AND METHOD FOR FORMING SERIAL NUMBERS ON HDD WAFERS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. §112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A wafer comprising:

a wafer body having a plurality of devices formed upon the wafer, wherein each of said devices has a unique serialization number associated with it and wherein the serialization number is not adjacent to the wafer back surface, the wafer including a wafer number including alphanumeric characters at least a first one of which corresponds to a specific reticle and location on that reticle, such that the reticle, location on the reticle for the first alphanumeric character, and the location of the first alphanumeric character on the wafer determine a stepper job from a plurality of jobs.

2. A wafer, comprising:

a front surface and an opposed back surface;

indicia on the front surface representing a location on the wafer of each of plural slider regions;

at least one serial number on the front surface representing the wafer itself; and a material which is transparent to a reading device that is to be used to read the indicia encapsulating the indicia such that no unfilled cavities are associated with the indicia to trap contaminants on the wafer.

* * * * *